US000001199H

United States Statutory Invention Registration [19]

[11] Reg. Number: H1199

Korn et al.

[43] Published: Jun. 1, 1993

[54] MULTI-GHZ FREQUENCY DIVIDER

[76] Inventors: David S. Korn, 5205 Sherrier Pl. NW., Washington, D.C. 20016; Carl Deierling, 11130 Eton Ave., Chatsworth, Calif. 91311

[21] Appl. No.: 706,481

[22] Filed: May 28, 1991

[51] Int. Cl.[5] ..... H03K 21/06

[52] U.S. Cl. ..... 377/47; 377/111; 377/114

[58] Field of Search ..... 328/25; 377/47, 48, 377/111, 114

[56] References Cited

U.S. PATENT DOCUMENTS

| | | | |
|---|---|---|---|
| 3,873,815 | 3/1975 | Summers | 377/47 |
| 4,366,394 | 12/1982 | Clendening et al. | 377/47 |
| 4,651,334 | 3/1987 | Hayashi | 328/25 |
| 4,688,237 | 8/1987 | Brault | 377/48 |
| 4,715,052 | 12/1987 | Stambaugh | 377/47 |
| 4,730,349 | 3/1988 | Wilhelm et al. | 377/47 |
| 4,845,727 | 7/1989 | Murray | 377/47 |
| 5,048,065 | 9/1991 | Kessler et al. | 377/47 |

*Primary Examiner*—Bernarr E. Gregory

[57] ABSTRACT

A frequency divider uses a single D flip-flop integrated circuit having an inverted output and an asynchronous clear input between which a feedback loop comprising a delay Tau is connected. The frequency divider receives a multi-GHz input frequency $f_1$, and divides by any integer N to produce an output frequency $f_2=f_1/N$ using the internal delay of the D flip-flop between input and output (CK-to-Q), and the internal delay between the asynchronous clear input to the output (CLR-to-Q). Solving for the amount of delay Tau in the feedback loop necessary to produce the desired integer, or divide ratio, N, according to a predetermined formula is also required. An integrated circuit D flip-flop manufactured by Gigabit Logic is preferably selected to provide the high input frequency capability, external to which is added the feedback loop for determining the divide ration desired. The divide ratio, or integer by which the input frequency is divided, includes the ability to divide by a non-$2^n$ number.

8 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

MULTI-GHZ FREQUENCY DIVIDER

FIELD OF THE INVENTION

The present invention relates generally to frequency divider circuits, and more particularly to a frequency divider capable of dividing an input frequency above 1 GHz by any integer, including a non-$2^n$ number, using a single flip-flop circuit.

BACKGROUND OF THE INVENTION

Frequency divide circuits are found in numerous applications. They play an integral part, in particular, when used in connection with radio frequency (RF) synthesizer techniques. The majority of frequency dividers are realized digitally by the use of edge triggered flip-flops, while the remainder are realized as analog circuits based on varactor diodes and resonant circuits.

Digital divider circuits based upon edge triggering are designed by configuring a flip-flop to change state on a rising or a falling edge, but not on both. This constitutes, in effect, a divide-by-2 circuit. A divide-by-$2^n$ circuit (i.e. one having a divide ratio $N=2^n=2, 4, 8$, etc.) is made by cascading the desired number of flip-flops. If the goal is a non-$2^n$ divide ratio (i.e. $N=3, 5, 6, 7$, etc.), a feedback circuit between flip-flops can be used, and there are many ways to do this. Both off-the-shelf, pre-designed dividers with fixed divide ratios and dividers custom constructed by the equipment designer using the industry-standard 4-bit counter are built on this technique.

For example, Plessey Semiconductor currently offers the most comprehensive selection of pre-designed dividers, all constructed of silicon. The following are representative of the highest input frequency, odd ratio dividers currently offered for $N<10$: the SP8720 divides by 3 at a maximum input frequency $F_{max}=300$ MHz; the SP8620 divides by 5 at $F_{max}=400$ MHz; the SP8740 divides by 6 or 7 at $F_{max}=300$ MHz; and the SP8743 divides by 9 at $F_{max}=500$ MHz.

Gigabit Logic currently offers the highest non-$2^n$ divider, the 10G070, which is a 2.0 GHz dual-modulus divider. However, it divides by 5 or 6 only. To divide by 3, 5, 6, 7 or 9, the above identified products of Plessey Semiconductor or Gigabit Logic are the options.

For custom designs in the digital category, the 4-bit programmable counter with ripple count output, enable input, asynchronous clear and preset terminals readily lends itself to $2^n$ and non-$2^n$ frequency division. This device is available in CMOS, TTL, ECL and Gallium Arsenide (GaAs) circuit technologies. CMOS and TTL counters, which many companies manufacture, have maximum input frequencies at about 100 MHz. Motorola, for example, makes an ECL counter (the MC10H016) with a 200 MHz maximum input frequency. Gigabit Logic makes a GaAs counter (the 10G061) with a 1.3 GHz maximum input frequency. However, due to propagation delays, feedback circuits inherently reduce maximum input frequencies, often by a multiplicative factor of 0.60 to 0.80, compared to the same flip-flops configured for straight $2^n$ divide ratios with no feedback.

As for the analog option, such frequency divider circuits are based on, and designed with, varactor diodes and are not widely used or available. This may be for the following reasons: the non-$2^n$ divide ratio devices (limited to $N=3$) generate many high-level spurs and subharmonics; they are easily prone to isolation; and they have a very small input RF power range beyond which they are unstable. These characteristics have been discovered from measurements made on an analog divide-by-3 circuit.

In view of the above, it can be concluded that the only prepackaged divider above 500 megahertz (MHz) input frequency is limited to divide ratios of 5 and 6, and the maximum input frequency of a 4-bit counter set for a non-$2^n$ divide ratio is 1 GHz.

Thus, while there are many multi-GHz input $2^n$ dividers, i.e. with a divide ratio $N=2, 4, 8, 16$, etc., frequency dividers are not currently available for dividing a high input frequency by a non-$2^n$ number.

Various prior art patents have been directed to frequency division. Among those of interest are the following.

In U.S. Pat. No. 4,651,334 (Hayashi), a variable divider that uses a transmission delay to determine a frequency division number is disclosed. Various factors that are included in a time delay feedback loop, which also is connected between a Qbar output to a Reset (clear) input of a D flip-flop integrated circuit. Two D flip-flops are used in the disclosed circuit.

In U.S. Pat. No. 4,845,727 (Murray), a divider circuit is disclosed that uses two D flip-flops where the output of the first flip-flop is fed into the input of the second, and the Qbar output of the second flip-flop is used to drive the first flip-flop via a feedback circuit. The feedback circuit described is placed between the Qbar output and the CLR input of only one of the D flip-flops.

In U.S. Pat. No. 4,730,349 (Wilhelm, et al.), a wideband frequency divider is disclosed that uses two D flip-flops with a feedback loop comprising a memory circuit. The two flip-flops used are connected in a master-slave relationship.

In U.S. Pat. No. 4,715,052 (Stambaugh), a frequency divide-by-N circuit is disclosed where the division is accomplished by use of shift registers to provide an output of f/n. The circuit described does not incorporate the use of D flip-flops, but does display the ability to generate a divide-by-N circuit where N is an odd number.

In U.S. Pat. No. 4,688,237 (Brault), a device for use as a frequency divider in generating clock signals is disclosed. General background information for generating clock signals at a fractional frequency of a reference frequency is also disclosed.

In U.S. Pat. No. 3,873,815 (Summers), a circuit is disclosed for providing a frequency division by an odd integer. Also disclosed is the use of a single D flip-flop as a frequency divider having the ability to divide by an odd integer where $n \leqq 5$ and two D flip-flops where $n>5$. The patent describes use of a binary counter in the feedback circuit of the D flip-flop. The Qbar output of the flip-flop is not directly fed back in the described divider circuit.

In U.S. Pat. No. 4,366,394 (Clendening et al.) use of a master-slave D flip-flop combination is disclosed that uses the Qbar output connected as a feedback loop to the reset (clear) of the first D flip-flop. The signal fed back is first passed through a NOR gate and then is delivered to the reset input. The feedback circuit includes logic processing, and also two D flip-flops are used for the divide-by-3 capability of the described circuit.

SUMMARY OF THE INVENTION

In accordance with the present invention, a frequency divider circuit is provided which is capable of dividing a multi-GHz input frequency by any integer. The frequency divider is most useful when the integer chosen is a non-$2^n$ number.

According to a first aspect of the present invention, a frequency divider is provided using a high-speed, digital flip-flop integrated circuit (D flip-flop) with a delay Tau feedback to a flip-flop CLR input. The divide ratio N is controlled by selecting a value for the delay Tau.

The frequency divider circuit of the invention makes use of favorable inherent characteristics found in the advances made in high-speed digital integrated circuits (ICs). The most notably of these characteristics are the lack of measurable spurious oscillations as the input RF frequency, RF power, DC voltage and ambient temperature are changed, a scarcity of undesired subharmonics, very small size, low DC power consumption, low input RF drive, and moderate RF power output delivery. The frequency divider circuit, by being designed around a high speed digital flip-flop (IC), provides a divider circuit for dividing by non-$2^n$ ratios at input frequencies above 1 GHz and is thus ideally suited for RF synthesizer applications.

According to a second aspect of the present invention, a method is described for designing a multi-GHz input, fixed ratio frequency divider circuit capable of dividing by any integer. The design method utilizes the same D flip-flop circuit used in the apparatus aspect of the invention, and uses a delay Tau in the feedback loop. The D flip-flop chosen has an inverted Q output (Qbar), and an asynchronous clear input (CLR), where the feedback loop comprising a delay Tau is between output Qbar and input CLR. The D flip-flop, having a maximum clock frequency as listed by its manufacturer, is also provided with an input frequency port, a hand wired logic input port, and an output Q where an output frequency port is produced.

Other features and advantages of the invention will be set forth in, or apparent from, the detailed description of preferred embodiments of the invention which follow.

DETAILED DESCRIPTION OF THE PREFERRED EMBODIMENTS

Figure 1:
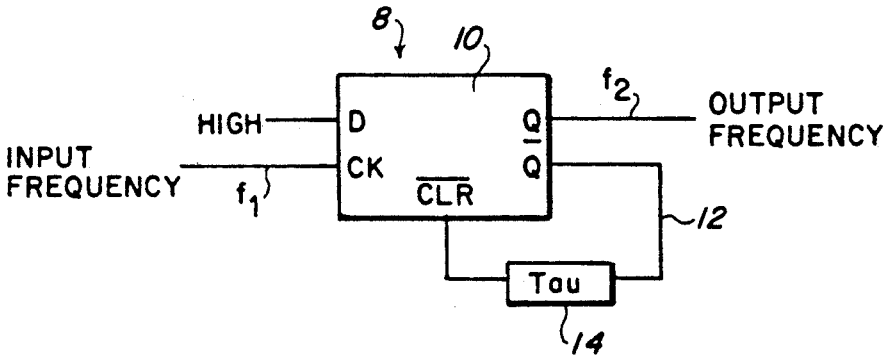
FIG. 1 is a block diagram of a frequency divider according to the present invention showing use of a D flip-flop integrated circuit with a feedback delay Tau loop.

Referring to FIG. 1, there is shown the basic components of a 1.8 Ghz input frequency divider 8 in accordance with the present invention. Frequency divider 8 includes a D flip-flop integrated circuit 10 having a feedback loop 12 comprising a delay Tau 14. As shown in the block diagram of FIG. 1, and in more detail in FIG. 3 where external components are shown added to integrated circuit 10, flip-flop IC 10 has an input CK where a clock signal or input frequency $f_1$ is received, and an input D for receiving a logic control signal An output is provided at Q where a frequency $f_2$ is produced, being $f_1$ divided by an integer N, such that $f_2=f_1/N$. Flip-flop IC 10 also has an inverted output Qbar and an asynchronous clear input CLR between which is connected feedback loop 12 comprising a delay Tau 14.

In a currently preferred embodiment, flip-flop IC 10 is Gigabit Logic's 10G021A-2L integrated circuit, a gallium arsenide (GaAs) dual flip-flop device. It should be appreciated that the apparatus and method of the invention requires that the selected flip-flop circuit have an asynchronous clear input. This particular IC is the highest input frequency D flip-flop that is presently available having an asynchronous clear input.

For small values of Tau, a passive delay can be conveniently realized through use of a coaxial cable, a microstrip transmission line or a piece of wire. It is helpful if the equation linking delay line physical length to time delay is known; however, the physical length of the delay line can be determined by trial and error with rapid conversions. For larger values of Tau, an active delay is preferred as the size of the passive delay increases linearly with the required delay.

The operation of frequency divider 8 of FIG. 1, including real-time propagation delays, is explained with reference to the timing diagram of FIG. 2. A frequency $f_1$ of 1.4 GHz is inputted at CK of flip-flop 10, represented by the CK top graph in FIG. 2, having a cycle time of 714 picoseconds (picosec), as indicated. The cause and consequence of each change of state in the signals appearing at input CK, outputs Q and Qbar, or input CLR of D flip-flop IC 10 with respect to time is marked by the events identified with numerals 1–7 along the x axis in FIG. 2. Specific occurrences at each point in time are as indicated in the discussion which follows.

At event -1-, on the clock signal falling edge, the D input is strobed into the flip-flop. D is hard-wired logic high and the particular flip-flop is negative edge triggered. Whether the particular flip-flop used is negative or positive edge triggered is inconsequential. The state of output Q prior to event -1- is irrelevant.

At event -2-, as a result of event -1-, the Q and Qbar outputs go high and low respectively after the CK-to-Q and Qbar delay. This delay is represented in FIG. 2 by the arrowed time period CK D, in this case is equal to 525 picosecs.

At event -3-, signal Qbar low appears at the CLR input a time delay Tau after event -2- as a result of feedback loop 12. There are no changes in Q due to any clock falling edges that might occur between events -2- and -3- since the D input is hard-wired high and Q is already high.

At event -4-, as a result of event -3-, the Q and Qbar outputs go low and high, respectively, after the CLR to Q and Qbar delay. In this case the delay is 625 picosecs, represented in FIG. 2 by the arrowed time period CLR D.

At event -5-, since the CLR input is merely the Qbar output delayed by Tau, the CLR port goes high (is deactivated) following a time delay Tau after the occurrence of event -4-. It is to be noted that between events -3- and -5-, when the CLR input is low, the clock input CK has no effect on the state of either output Q or Qbar.

At event -6-, a repeat of the event at -1- occurs, where the D input is strobed into the flip-flop, and output Q is low at this time.

At event -7-, as a result of the event at -6-, Q again changes state and goes high after the CK-to-Q delay, thus completing one frequency division cycle.

Given the preceding explanation, the value of Tau is chosen such that 2Tau plus both CK-to-Q and CLR-to-Q delays is greater than N-1 input clock cycles and less than N clock cycles, where N is the desired divide ratio. This is stated in equation form as follows:

$$(1\text{CK cycle})(N-1) < 2\text{Tau} + \text{CK-to-Q} + \text{CLR-to-Q} < (1\text{CK cycle})(N) \text{ second} \quad 1$$

This is the pertinent design equation, and the objective is to solve for Tau given a known (desired) value of N.

Figure 2:
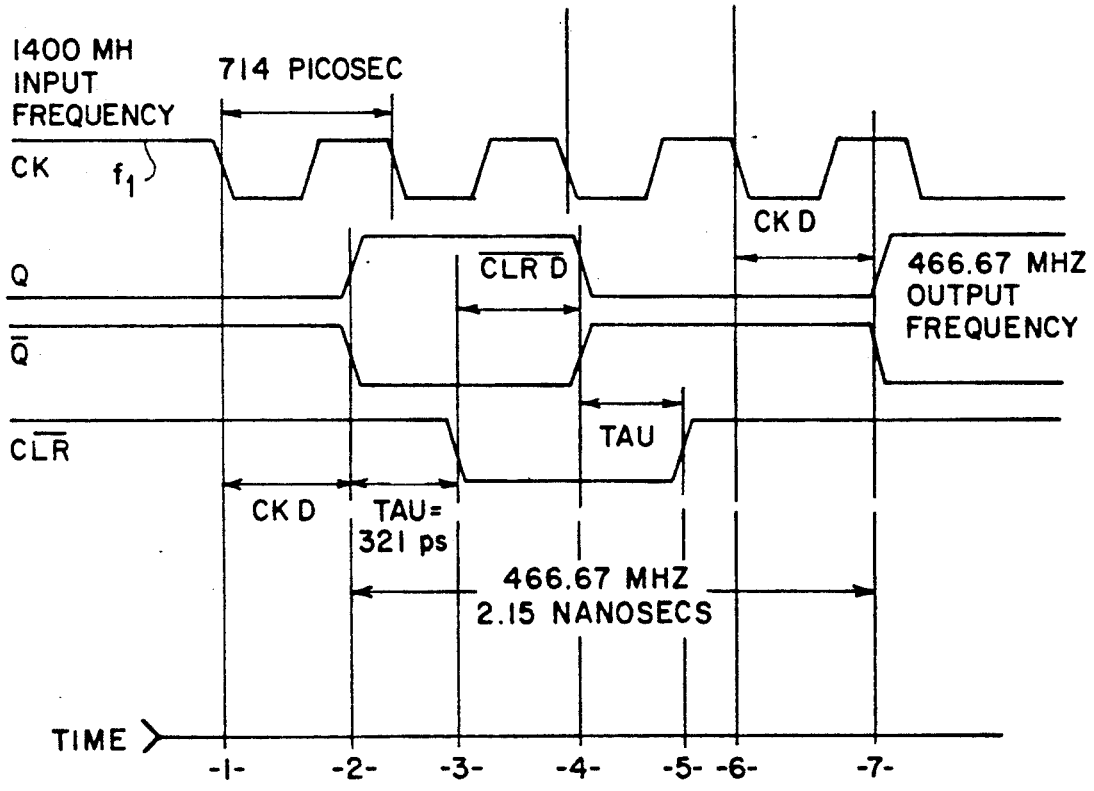
FIG. 2 is a timing diagram showing a time relationship between various signals associated with the frequency divider of FIG. 1.

As shown in the timing diagram of FIG. 2, the input-to-output time delay of this circuit is the D flip-flop internal CK-to-Q delay. In this case the delay is 525 picosecs represented by the time period CK D between events -1- and -2-.

This technique can also be used to build a high-speed dual modulus prescalar. The only change in the circuit would be to have 2 delay lines coming from the Qbar output to a 2:1 mux, such as Gigabit Logic's 10G004 Quad 2:1 mux, and connect the mux output to the CLR input. The mux control signal selects which delay line is in the circuit, thereby selecting the divide ratio N.

A number of companies make multi-GHz frequency input $2^n$ dividers. For example, Avantek makes the IFD-01110 (a silicon 4.5 GHz divide-by-4), Plessey Semiconductor makes the SP8808A (a silicon divide-by-8), and NEC makes the UPG501B (a GaAs 5 GHz divide-by-4) and the UPG506B (a 14 GHz GaAs divide-by-8). These dividers are built with flip-flops as described previously. However, they do not have asynchronous clear inputs, thereby making them ineligible for use in the frequency divider circuit 8 according to the invention, which includes frequency division by non-$2^n$ values of N. While frequency divider 8 disclosed herein is useful with input frequencies up to 1.8 GHz, the input frequency capability of non-$2^n$ dividers built with the technique according to the present invention will increase as dividers and D flip-flops with asynchronous clear inputs become available with increased input frequency capabilities. If these dividers and flip-flops can be made of silicon instead of GaAs, the improvement of residual phase noise, specifically the 20-to-40 dB decrease of the 1/f point, will make this technique better suited for lowest possible phase noise synthesizers. The choice in using Gigabit Logic's 10G021A-2L circuit is based on it being the highest input frequency D flip-flop with an asynchronous clear input that is presently available.

With respect to the method of constructing a frequency divider according to the invention, the circuit design procedure is summarized as follows:

1. The available input frequency and the required output frequency are generally pre-existing conditions, or are system-imposed specifications, over which the circuit designer has no control. Even if this is not the case, the input and output frequencies determine the value of the divide ratio N; thus N is assumed to be known or determined at the start.

2. The next step is to select the D flip-flop. Assuming the input frequency is greater than 200 MHz, all commonly available logic families are ruled out except those of GaAs, with the added requirement that the flip-flop must have an asynchronous clear input. Synchronous Q and Qbar outputs are preferred but are not essential. The only relevant AC parameters of the chosen flip-flop are the CK-to-Q and CLRbar-to-Q delays, and these must be known or measured in order to proceed in an analytical, as opposed to an empirical, fashion when choosing Tau. The maximum operating frequency of the frequency divider of the invention, comprising the chosen D flip-flop with a feedback delay Tau, is limited by the above mentioned delays and the flip-flop maximum input frequency, as well as the external delays that comprise Tau. Consequently, the divider maximum frequency is typically about 0.6 to 0.8 times the flip-flop rated maximum frequency, assuming the shortest possible external (Tau) delay. As shown by the above equation, it is the Tau parameter that determines the divide ratio N. As the Tau delay is increased, the maximum divider input frequency will be additionally decreased beyond the 0.6 to 0.8 factor given above. Therefore, as N is increased, the divider maximum frequency is decreased, which is a consideration to be mindful of when selecting the flip-flop to use in the frequency divider.

3. The next step is to determine the value of the feedback delay Tau that must be introduced to achieve the desire divide ratio N, by use of the above equation.

Figure 3:
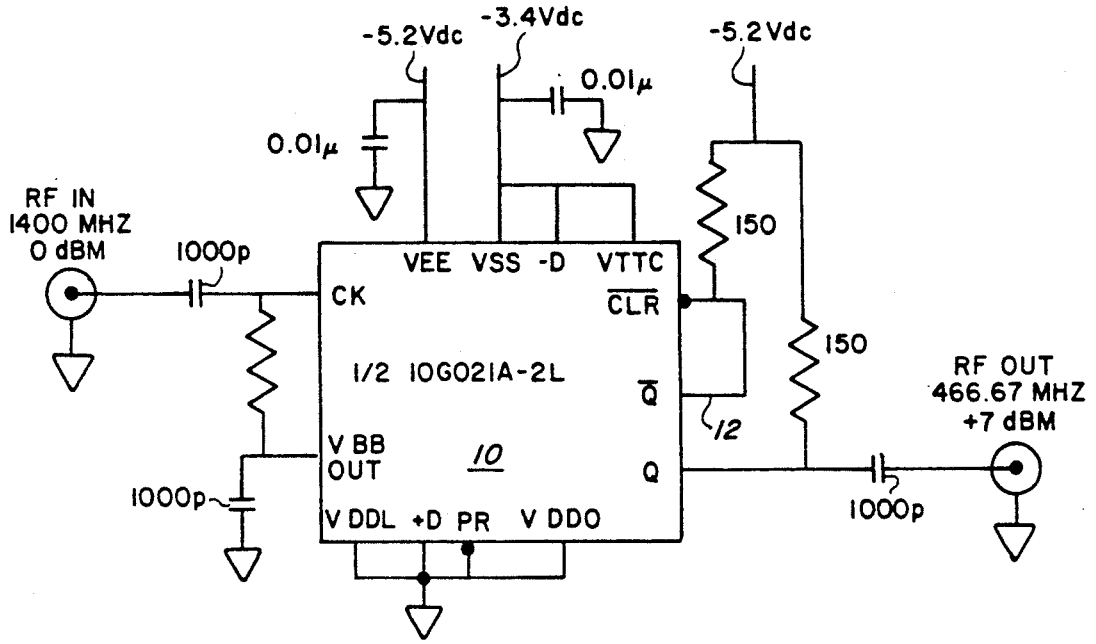
FIG. 3 is a more detailed schematic of a frequency divider according to the invention showing external components about the D flip-flop integrated circuit.

4. The last step is merely to determine the practicalities dictated by the already chosen flip-flop and delay line. FIG. 3 shows in more detail the circuitry built around the Gigabit Logic 10G021A-2L D flip-flop with actually only one half of the dual flip-flop circuit (2.7 GHz dural D precision flip-flop) being used. Feedback 12 comprising a delay Tau is formed with a 0.6 inch strip of 30 AWG wire extending from Qbar output to the CLR input. Other external components are as indicated, and since these involve components known in the art, no further detailed discussion of them is necessary. However, it should be noted that no special circuits, such as tuned or diode clamping circuits, are required. The following important practicalities are also to be noted: even though the circuit concept is digital, being based on, and realized with, an edge triggered device in accordance with the timed events discussed earlier with respect to FIG. 2, the circuit should be considered as an RF circuit and designed accordingly. For example, chip capacitors and resistors must be used for RF line terminations, for flip-flop output voltage pull downs, and for AC decoupling and DC blocking. Leaded D blocking capacitors at the output (output Q of the flip-flop 10 in FIG. 3) have been found to cause spurious frequencies near the carrier, resulting in the destruction of many frequency synthesizer circuits.

DESIGN EXAMPLE

The following design example was used where an input frequency between 450 MHz and 550 MHz was required to a RF frequency synthesizer in a transmitter module for a military communications hardware design effort, from a 1400 MHz reference source. Small space and low spurious were of paramount importance, along with other specification requirements. The pertinent specifications imposed on the frequency divider are summarized as follows:

| | |
|---|---|
| Input Frequency: | 1400 MHz |
| Output Frequency: | 1400 MHz divided by 3 (466.67 MHz) |
| Spurious: | −80 dBc maximum |

-continued

| | |
|---|---|
| Residual phase noise: | lower than −130 dBc/Hz for offset >50 KHz |
| Unconditionally stable | |
| DC power dissipation less than 1 watt | |
| Smaller than 1.00 × 1.50 × 0.50 inches | |
| Operate over −55C < Tcase < +65C | |

The circuit was designed in accordance with the invention around a D flip-flop with a feedback Tau and, as further described below, either met or exceeded these specifications.

The flip-flop chosen was Gigabit Logic's 10G021A-2L, a dual D flip-flop with a 2.7 GHz maximum clock frequency as described above. Only one flip-flop of the two in the chosen IC was needed to be used. The required delay Tau for N=3 is calculated using the above equation, which dictates that the 1400 MHz has a cycle time of 714 picosecs. Therefore, the sum of all 3 delays according to the above equation must be:

$$1428 \text{ picosecs} < 2\text{Tau} + \text{CK-to-Q} + \text{CLR-to-Q} < 2142 \text{ picosecs}$$

In the flip-flop being used, the CK-to-Q delay=525 picosecs, and the CLR-to-Q delay=625 picosecs. Thus:

$$140 \text{ picosecs} < \text{Tau} < 496 \text{ picosecs} \quad (2)$$

In view of the above, a design goal range for Tau of 200 picosecs to 400 picosecs was chosen.

The next step is to try to account for all delays that comprise Tau. In order to do this, a detailed description of the physical circuit layout is necessary.

Figure 4:
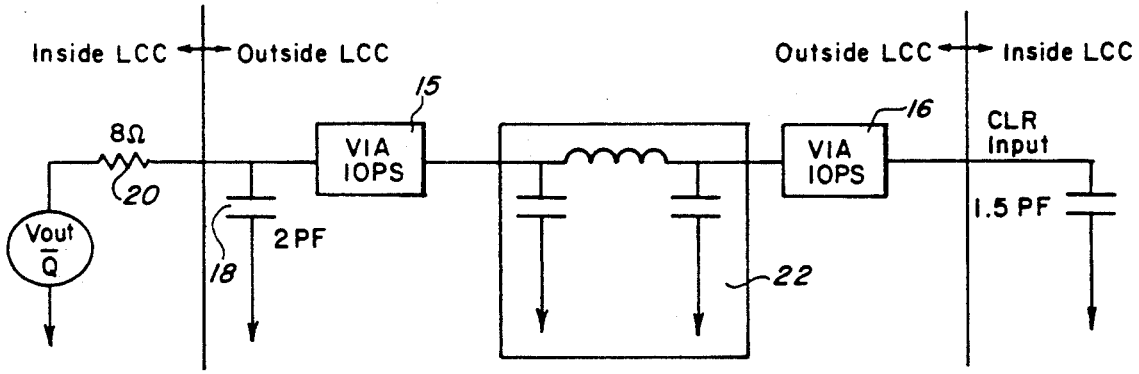
FIG. 4 is an equivalent circuit schematic for the feedback loop and delay Tau connected to the D flip-flop integrated circuit.

The Gigabit Logic 10G021A-2L dual D flip-flop is packaged in a 40 pin housing that is 0.480×0.480×0.105 inches. It is directly soldered to the top of a Gigabit Logic prototype board, the 90GUPB, a four layer 70 mil thick board made of G-10 material. The top side of the circuit board has 200 mil long 50 ohm microstrip lines, and the bottom side has plated through vias, both corresponding to each of the 40 "pins". The two middle layers are used for DC voltage distribution only and are not part of the delay Tau. For the sake of soldering convenience, Tau was implemented by a piece of wire-wrap wire, 30 AWG, and was soldered on the bottom side of the board between the Qbar output (pin 22) and CLR input (pin 29) plated-through holes. With this physical construction, the inherent time delays are considered with reference to the equivalent circuit of FIG. 4, the significant delays being summarized as follows:

(1) Assume a 10 picosec phase delay at each end 15, 16 of the wire in FIG. 4 due to the path from the housing through the via to the plated-through hole on the bottom side of the board. This is thus a 20 picosec delay.

(2) The 200 mil long 50 ohm line on top of the board is not used or terminated, and thus is a capacitive open stub driven by a low impedance source. With a 2 pf capacitance 18 and an 8 ohms (Ω) resistance 20, this yields a time constant of (8 Ω)×(2 E-12pf)=16 picosecs.

(3) The largest inherent delay is due to a combination of the shunt capacitance of the CLR input port and the Tau transmission line, represented by block 22 in FIG. 4. A piece of 30 AWG wire laying flush to the board bottom has a characteristic impedance of about 150 Ω and the CLR port input capacitance is estimated at 1.5 pf. This yields a constant=(150 Ω)×(1.5E-12 pf)=225 picosecs.

The following pertains to the inherent time delays of (2) and (3) above. One RC time constant is 0.63 of final voltage. Considering that the voltage levels are −0.6 V for logic state 1 and −1.7 for logic state 0, then:

$$-0.6 \text{ V} - (0.63) \times (1.1 \text{ V}) = -1.29 \text{ V}$$

which is the threshold point of an ECL circuit. Therefore, one time constant is equal to the time it takes an ECL level voltage swing to go from a logic state 1 to the threshold voltage.

Summing the time delays due to (1), (2) and (3), above, yields:

$$20 + 16 + 225 = 261 \text{ picosecs}$$

which is the calculated value of total inherent time delay that the designer has little control over. The designer can chose the physical length of line Tau, and this is added to the inherent delay of the circuit. In this example, a 0.7 inch long piece of wire-wrap wire was chosen. Converting this length to meters gives:

$$(0.7 \text{ in}) + (39.3 \text{ in/m}) = 0.018 \text{ m}$$

and using this length in meters yields the following time delay produced by this physical length of line:

$$(0.018 \text{ m}) \div (3 \text{ E8 m/s}) = 60 \text{ picosecs}$$

Therefore, the total calculated delay Tau is 261+60=321 picosecs.

This design process closely correlated with "reality", or in other words, the actual measured results. It was not necessary to empirically change the length of wire to achieve the desired result, and the min and max frequency for N=3 were 1.2 GHz and 1.8 GHz, respectively, indicating that the delay Tau was slightly lower than mid value. The other "nuts and bolts" of the circuit design, such as choosing pull-down resistors and decoupling capacitors, are standard ECL and GaAs design considerations well known in the art; thus they merit no further mention here other than to note that the Gigabit Logic 10G021A-2L accepts and puts out ECL compatible voltage levels.

Measured Results

In the design, it is necessary to be mindful of avoiding low-level spurious oscillations being generated close to the output frequency. As used herein, spurious oscillation frequencies are defined as frequencies not harmonically or subharmonically related to the input frequency. It was found in the preceding design that it was necessary to replace a leaded 330 pf chip capacitor (cap) with a non-leaded one functioning as the Q output DC block element, because the leaded cap induced such undesired low level spurious oscillations close to the output frequency.

The features and measured results of the frequency divider according to the invention and in the design example described hereinabove are summarized as follows. In the measurements conducted, the 1.4 GHz input frequency source was the HP 8642B, a spectrally pure synthesized signal source, and the spectrum analyzer was the HP 8566B.

| | |
|---|---|
| INPUT FREQUENCY (Fin) OF INTEREST & DESIRED DIVIDE RATIO (N): | |
| 1.4 GHz & N = 3 | |
| INPUT FREQUENCY RANGE: | |
| (for Tau fixed for N = 3) | |
| 1210 MHz < Fin < 1810 MHz | N = 3 |
| Fin > 1810 MHz | No output frequency |
| 1180 MHz < F < 1200 MHz | N = 5 & 7 unstable) |
| 590 MHz < F < 1170 MHz | N = 2 |

Note that the maximum operating frequency, 1810 MHz, is about 0.67 of the specified maximum clock frequency of the chosen flip-flop. Also note that as the input frequency Fin is decreased, the divide ratio decreases, as predicted.

| | | | |
|---|---|---|---|
| OUTPUT HARMONICS: | 2d | (933.33 MHz) | −9 dBc |
| (c = 466.67 MHz @ +7 dBm) | 3d | (1400 MHz, input) | −22 dBc |
| | 4th | (1866.67 MHz) | −16 dBc |
| | 5th | (2333.33 MHz) | −20 dBc |
| | 19th | (8.86 GHz) | −70 dBc |

From the above, note that the 10G021A-2L out an ELC compatible waveform with high odd harmonic content due to the 150 picosecs rise and fall times.

| | |
|---|---|
| INPUT SUBHARMONICS: | Fin/6 (233:33 MHz) −71 dBc |
| (other than integer | Fin/2 (700 MHz) −69 dBc |
| multiples of F/3) | No others greater than −85 dBc |
| SPURIOUS: | None greater than −85 dBc (floor of spectrum analyzer) |
| RESIDUAL PHASE NOISE floor: | −130 to −140 dBc/Hz |
| (estimated, not measured) 1/f corner: | 10 KHz to 100 KHz |
| REQUIRED RF INPUT POWER: | 0 dBm minimum<br>+17 dBm maximum<br>(−4.0 to +0.5 V @ 50Ω)<br>+5 dBm (2.0 V pk-to-pk) recommended |
| OUTPUT POWER INTO 50Ω: | +7 dBm |
| DC POWER: | −5.2 V @ −75 mA = 0.39 watts<br>−3.4 V @ −74 ma = 0.25 watts<br>total = 0.640 watts |
| SIZE: | occupies about 0.80 × 0.80 × 0.20 excluding SMA connectors |

Since the 10G021A-2L is a dual D flip-flop, a second separate frequency divider circuit can be built with the same housing (the housing used in the Gigabit Logic IC being referred to as "LCC", as indicated in FIG. 4), resulting in little, if any, increase in these dimensions and DC power consumption.

OPERATING TEMPERATURE: All measurements made at room temperature. Neither cold spray or heat gun caused deleterious effects (except a 1.0 dB decrease in output power) when observed on the spectrum analyzer. The only active device used is the flip-flop, 10G021A-2L, which is specified over 0° C.<Tcase<+85° C. and is available specified over −55° C.<Tcase<+125° C.

MILITARY SPECIFICATIONS: The 10G021A-2L can be purchased in MIL-SPEC version.

TIME DOMAIN: A time domain measurement of the output using the HP 54111D digitizing oscilloscope revealed a periodic non-sinusoidal waveform that had the characteristics of a wave rich in harmonics with a 3.4 V pk-to-pk @1MΩ impedance and 1.4 V pk-to-pk @50 Ω impedance.

INPUT SPURS & PHASE NOISE: As with all other input-voltage limiting frequency dividers, this circuit reduces the magnitude of input spurs and phase noise and eliminates AM spurs and noise. Summarized is the exact effect of this circuit on spurs and noise associated with the input frequency:

Phase noise and FM & PM spurs: Reduced by (20)LOG(N)dB. For N=3 this yields a 9.5 dB reduction at the output with respect to the input.

AM noise & spurs: eliminated to non-measurable levels.

Single sideband spurs: Since a single sideband spur @ voltage Vspur is comprised on ½AM Vspur and ½PM Vspur, the AM half will be stripped off leaving only the PM half. Therefore, the spur will be −6 dB at the output with respect to the input and a spur of equal magnitude and offset frequency will be generated on the other side of the desired output frequency. This phenomenon is independent of the preceding phenomenon. For example, in the present design, an input SSB spur at 1470 MHz (70 MHz offset) @−40 dBc would yield at the output two spurs at 396.7 MHz and 536.7 MHz, both at −40 dBc−6 dB−9.5 dB=−55.5 dBc.

In summary, notable attractive features of this circuit from a frequency synthesis perspective are the apparent lack of spurious frequencies, (none greater than the analyzer's noise floor, about −85 dBc), a close correlation of the predicted delay Tau to actual value necessary to realize a desired divide ratio N, and circuit simplicity from both theoretical and practical perspectives.

Although the present invention has been described in relation to exemplary preferred embodiments thereof, it will be understood by those skilled in the art that variations and modifications can be effected in these preferred embodiments without departing from the scope and spirit of the invention.

We claim:

1. A fixed ratio frequency divider for dividing a multi-GHz input frequency by any desired integer N, comprising:

a single D flip-flop integrated circuit comprising an input frequency input (CK), an output (Q), an inverted output (Qbar) and an asynchronous clear input (CLR), said integrated circuit also having an internal CK-to-Q delay and a CLR-to-Q delay; and a feedback means for connecting a time delay (Tau) between the inverted output (Qbar) and the clear input (CLR) of said D flip-flop integrated circuit, said time delay (Tau) having a value such that twice the time delay value plus the CK-to-Q delay plus the CLR-to-Q delay is (a) greater than (N−1) input clock cycles and (b) less than N input clock cycles.

2. A frequency divider as claimed in claim 1 wherein said integrated circuit is one side of a dual GaAs flip-flop integrated circuit 3. A frequency divider as claimed in claim 1 wherein said output (Q) and said inverted output (Qbar) are synchronous.

4. A frequency divider as claimed in claim 1 wherein said feedback means includes a chosen length of wire.

5. A frequency divider as claimed in claim 1 and further including a Q output DC block element made up of chip elements.

6. A frequency divider as claimed in claim 1 wherein the value of said delay (Tau) is chosen so that N is a non $2^n$ number.

7. A method for dividing a multi-GHz input frequency by a desired integer N comprising the steps of:

connecting the input frequency to a single D flip-flop integrated circuit at an input (CK), the integrated circuit also including an output (Q), an inverted output (Qbar), an asynchronous clear input (CLR), an internal CK-to-Q delay and an internal CLR-to-Q delay; and connecting a feedback time delay (Tau) between the inverted output (Qbar) and the clear input (CLR) wherein a value of the time delay (Tau) is such that twice the delay time value plus the CK-to-Q delay plus the CLR-to-Q delay is (a) greater than (N−1) input clock cycles and (b) less than N input clock cycles.

8. A method for dividing an input frequency as claimed in claim 7 wherein said connecting the time delay (Tau) step includes an initial step of determining a length of wire based on the desired integer N to provide the desired delay time (Tau).

* * * * *